United States Patent [19]
Keyser

[11] Patent Number: 6,147,362
[45] Date of Patent: *Nov. 14, 2000

[54] HIGH PERFORMANCE DISPLAY PIXEL FOR ELECTRONICS DISPLAYS

[75] Inventor: Thomas Robert Keyser, Ellicott City, Md.

[73] Assignee: Honeywell International Inc., Morristown, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/819,413

[22] Filed: Mar. 17, 1997

[51] Int. Cl.[7] .......................... H01L 29/04; H01L 31/036; H01L 31/0376; H01L 27/01
[52] U.S. Cl. .............................. 257/59; 257/349
[58] Field of Search ....................... 257/59, 349

[56] References Cited

U.S. PATENT DOCUMENTS

| | | |
|---|---|---|
| 5,125,007 | 6/1992 | Yamaguchi et al. . |
| 5,235,195 | 8/1993 | Tran et al. . |
| 5,302,966 | 4/1994 | Stewart . |
| 5,359,219 | 10/1994 | Hwang . |
| 5,463,279 | 10/1995 | Khormael . |
| 5,489,792 | 2/1996 | Hu et al. . |
| 5,587,329 | 12/1996 | Hseuh et al. . |

FOREIGN PATENT DOCUMENTS 88-88202  10/1998  WIPO .

OTHER PUBLICATIONS

High–Resolution Active–Marix Electroluminescent Display; R. Kormaei et al.; SID 94 Digest—pp. 137–139, 1994.
A 1280 × 1024 Active–Matrix EL Display–R. Khormaei et al.; SID 95 Digest—pp. 891–893, 1995.
A 2000–1pi Active–Matrix EL Display, L. Arbuthnot et al.; SID 96 Digest—pp. 374–377, 1996.

*Primary Examiner*—Stephen Meier
*Attorney, Agent, or Firm*—Loria B. Yeadon

[57] ABSTRACT

A high performance pixel is described for active matrix electronic displays. The pixel combines a compact, mesa-isolated PMOS access transistor with a novel, area-efficient HV device. The high voltage transistor features a P+ region at each end of the source to effectively eliminate the parasitic sidewall component and raise the nominal threshold voltage. Concurrently, excess well area is eliminated from the PMOS access transistor to minimize device leakage and the undesirable capacitance component. The improved design enhances pixel response, increases operating margins and contrast and may reduce power dissipation in the off-state.

10 Claims, 5 Drawing Sheets

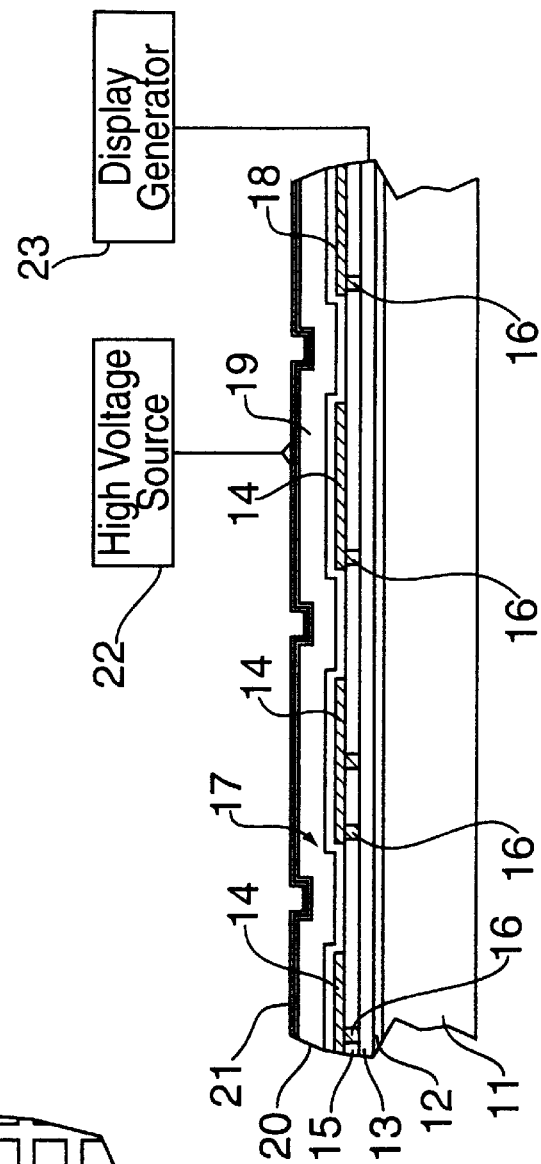
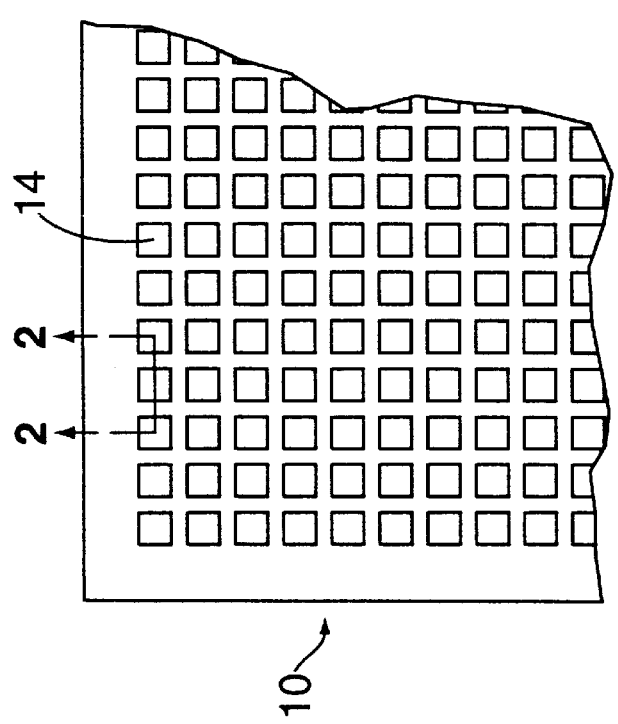
FIG. 1 PRIOR ART
FIG. 2 PRIOR ART

HIGH PERFORMANCE DISPLAY PIXEL FOR ELECTRONICS DISPLAYS

BACKGROUND OF THE INVENTION

This invention is related to the field of active matrix electronic displays, for example, an active matrix electroluminescent (AMEL) display used in head-mounted displays (HMD) because of their inherent lightweight, compactness and rugged qualities as well as low-power requirements; and more particularly, to an active matrix electroluminescent display having a plurality of high-performance pixels.

BACKGROUND ART

In a typical AMEL display, a plurality of metal pixel electrodes are formed as "islands" in a layer insulated from a silicon-on-oxide (SOI) structure in which the active semiconductor circuits are formed. These semi-conductor circuits are connected to the pixel electrodes through respective contact holes formed in the insulated layer. An electroluminescent (EL) stack is formed over the pixel electrodes; and this EL stack is a "sandwich" of EL material, typically phosphor, between top and bottom insulated layers. A transparent conductive layer, which receives the high voltage source, is provided on top of the EL stack; and this entire thin-film structure is on a base or substrate formed of silicon, glass, quartz or other suitable material.

In operation, a low-voltage transistor controls a high-voltage (blocking) transistor; and the high-voltage transistor turns on and "addresses" its associated pixel to illuminate the adjacent (or proximate) electroluminescent material in response to a signal received via a common pixel electrode, the signal being in the order of 100 to 400 volts (AC or DC).

Such an overall arrangement is disclosed in my earlier patent, U.S. Pat. No. 5,485,055 issued on Jan. 16, 1996 and assigned to the assignee of the present invention; moreover, in this '055 patent, the array of pixel electrodes has a uniformly textured surface for an enhanced brightness of the display.

The prior art includes the following publications (of which I am a co-author):

11.3: High-Resolution Active-Matrix Electroluminescent Display SID 94 DIGEST 137

42.3: A 1280×1024 Active-Matrix EL Display SID 95 DIGEST 891

24.3: A 2000-Ipi Active-Matrix EL Display 374 SID 96 DIGEST

Other prior art, of which I am aware, are U.S. Pat. Nos. 5,302,966; 5,463,279; and 5,587,329.

In the prior art, there is an inherent problem of coupling between adjacent pixels, which detracts from the overall resolution of the display; and there is a need for improved pixel response, better contrast and increased operating margins.

SUMMARY OF THE INVENTION

The present invention will be described in terms applicable to an AMEL for illustrative purposes only and is not intended to limit the applicability of the invention.

The present invention finds utility in an active matrix display wherein at least one controlling access transistor and one NMOS high voltage blocking transistor, having a source with an N+ region and a P+ region both terminating in respective side edges and a drain connected to the pixel electrode, are formed in a semiconducting material and wherein parasitic leakage currents develop along the respective device edges during operation.

In accordance with the teachings of the present invention, a P+ region is formed to coincide with the side edge of the N+ region or alternatively, P+ regions are formed to coincide along both edges of the high voltage device source to remove the parasitic sidewall transistor component, reduce sensitivity to substrate potential variations, facilitate an abrupt turn-off and raise the effective threshold voltage. For example, P+ regions may be added to the one or both of the side edges of the high voltage device or alternatively, the existing N+ region may be modified so that a portion of the N+ region becomes P+. Preferably, the well area of the access transistor is minimized to eliminate drain-source leakage and reduce undesirable capacitive coupling effects in the storage node. Implementation of the devices eliminates pixel coupling and enhances resolution, response and contrast.

Preferably, the contact hole to the HV device source is enlarged to enable electrical connection of the N+ and the extended P+ region or alternatively, both P+ regions. However, equivalent results can be obtained by connecting the regions by other means, for example by using a self-aligned silicide procedure which places a conductive layer selectively over the entire source region of the device. Comparable results may conceivably be achieved by contacting the N+ exclusively or by contacting the N+ and one of the P+ regions.

It is recognized that incremental improvements in pixel performance could be realized by implementing either one as well as both of the enhanced semiconductor devices or by reversing the polarity of one or both of the semiconductor devices, for example by implementing a high voltage PMOS transistor instead of the NMOS transistor. In such case, the source area would consist of a primary P+ region with N+ edge regions and the drain would consist of a P type region.

In a preferred embodiment, the electroluminescent (EL) display is an active matrix electroluminescent (AMEL) display, and the high-voltage transistor is formed on a silicon-on-insulator (SOI) thin film.

In accordance with the further teachings of the present invention, the high voltage and access transistors are placed within the pixel boundaries to conserve area and maximize array density and resolution.

These and other objects of the present invention will become apparent from a reading of the following specification taken in conjunction with the enclosed drawings.

BRIEF DESCRIPTION OF THE DRAWINGS

FIG. 1 is a partial top plan view (drawn to a greatly enlarged scale) of a preferred embodiment of an active matrix electroluminescent display with which the teachings of the present invention may find more particular utility.

FIG. 2 is a partial cross-sectional view thereof, taken along the lines 2—2 of FIG. 1, and drawn to an enlarged scale.

FIG. 7 shows the modifications made to the silicon island layer to implement the improved transistors.

FIG. 8 shows, schematically, the addition of the gates for the high-voltage and low-voltage devices.

FIG. 9 shows, schematically, the further addition of the highly-doped regions forming the N+ source and drain of the high-voltage transistor.

FIG. 10 shows, schematically, the implanting and penetration of the P+ regions.

FIG. 11 shows, schematically, the formation of the respective contact holes.

FIG. 12 shows, schematically, the metal deposition for various electrical connection purposes (as hereinafter described).

FIG. 13 shows, schematically, the addition of the via and the EL electrode.

DESCRIPTION

Figure 3:
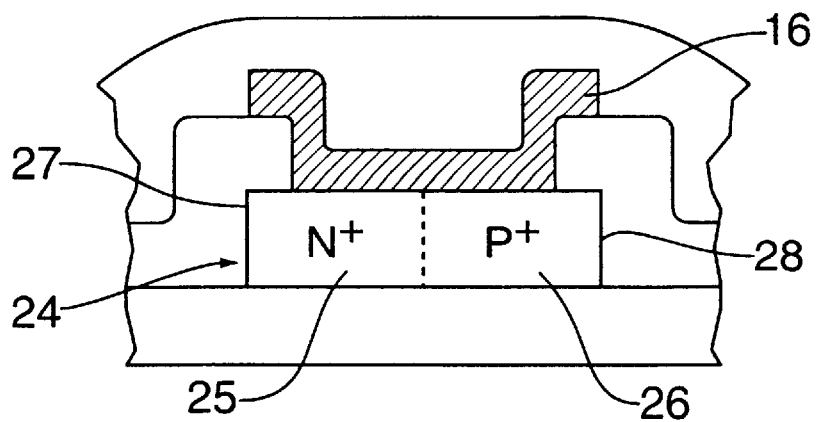
FIG. 3 is a portion of FIG. 2, drawn to an enlarged scale, and showing the conventional respective side edges or margins of the source end of the high-voltage transistor (and in relation to the contact hole) heretofore used in the prior art.

With reference to FIGS. 1 and 2 (and as disclosed in my aforementioned '055 patent) the active matrix electroluminescent (AMEL) display 10 includes a base substrate 11, a first insulator layer 12 and a silicon layer 13 forming a silicon-on-insulator (SOI) structure. The base substrate 11 may be silicon, glass or quartz; the first insulator 12 is typically silicon dioxide, and the silicon layer 13 has the active semi-conductor circuits formed thereon. An array of metal pixel electrodes 14 is formed on a second insulator layer 15. Each pixel electrode 14 is connected to an associated electronics circuit (formed on the silicon layer 13) through a contact hole 16 etched through the second insulator layer 15. An electroluminescent stack 17 includes a bottom insulator layer 18, an electroluminescent layer 19 (typically of phosphor) and a top insulator layer 20 formed over the pixel electrodes 14 and the exposed surfaces of the second insulator layer 15. A transparent conductive layer 21 is formed over the top insulator layer 20 of the electroluminescent display 17. This transparent conductive layer 21, which may be an indium tin oxide (ITO) layer, receives a high voltage (either AC or DC) from a high-voltage source 22. In operation, a display generator 23 triggers an electronic circuit (on the silicon layer 13) to selectively activate its associated pixel electrode 14. This produces a potential gradient between the pixel electrode 14 and the transparent conductive layer 21 to illuminate the electroluminescent display 17.

With reference to FIG. 3, the associated electronic circuitry on the silicon layer 13 includes a high-voltage (blocking) transistor 24, a section of which is illustrated in FIG. 3, comprising an N+ region 25 and a P+ region 26 at the source, respectively, and these regions 25, 26 have respective margins or side edges 27 and 28. The high-voltage transistor 24 is connected to its associated pixel electrode 14 through the contact hole 16. A metal deposit 16A within contact hole 16 serves as a data line between pixels 14 and connects the N+ and P+ regions of the source.

Figure 4:
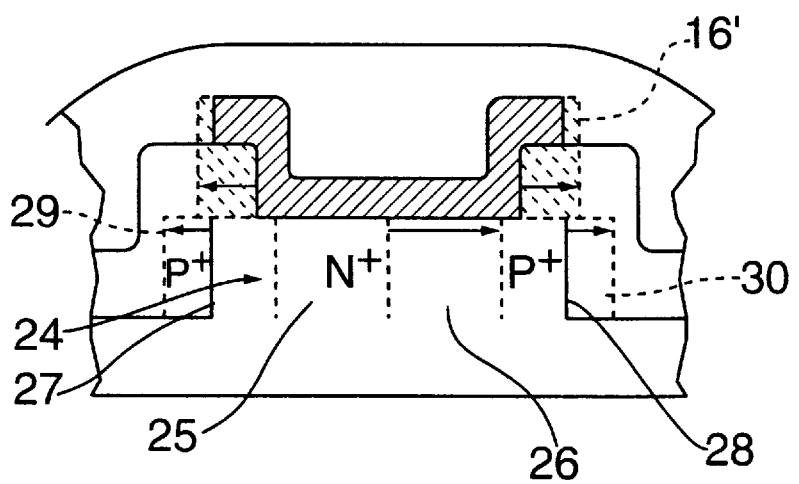
FIG. 4 corresponds substantially to FIG. 3, but shows (schematically) the high voltage device improvement of the present invention, wherein a P+ region is being extended from each side edge of the high-voltage transistor source, and wherein the contact hole will straddle the N+ regions and engages the respective extended P+ regions.
Figure 5:
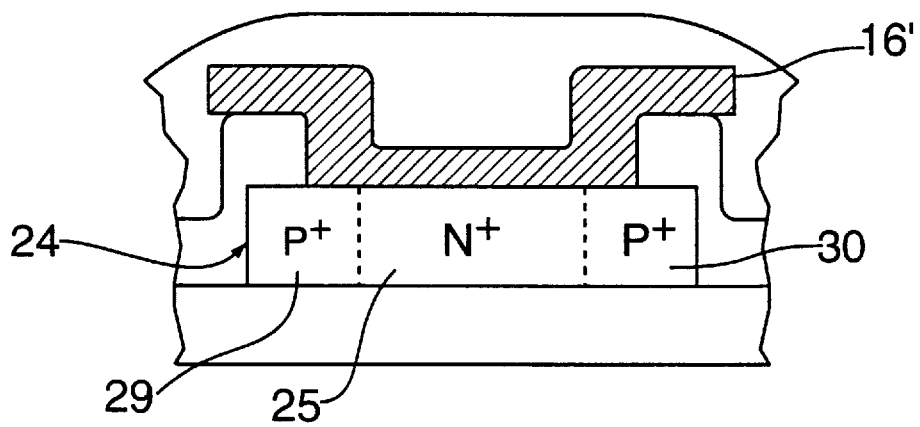
FIG. 5 is another cross-sectional schematic view taken along the lines 5—5 of FIG. 12, and showing the completed arrangement of FIG. 4.

With reference to FIGS. 4 and 5, and in accordance with the teachings of the present invention, P+ region 29 and P+ region 30 are extended from the respective side edges 27 and 28 of the high-voltage transistor 24 and the contact hole 16' has been enlarged to straddle the N+ region 25 and overlap the extended P+ region 29 and, optionally, the P+ region 30 or vice versa. Alternatively, portions of the N+ region 25 may be modified to become P+ regions, thus not requiring the N+ region to be extended.

Figure 14:
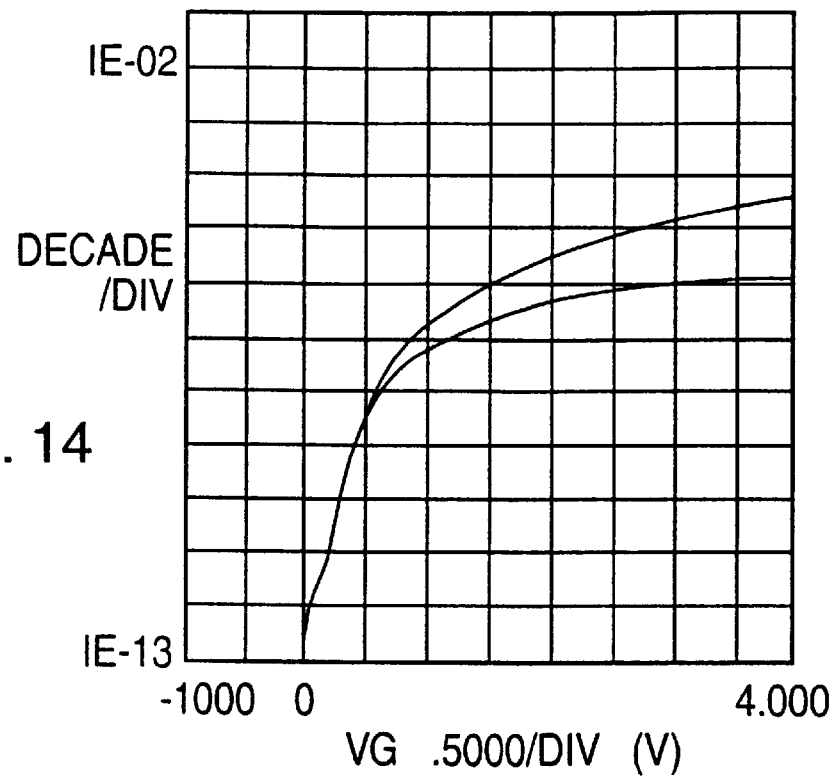
FIG. 14 is graphics plot, showing the subthreshold characteristic of the high-voltage transistor used in the prior art.
Figure 15:
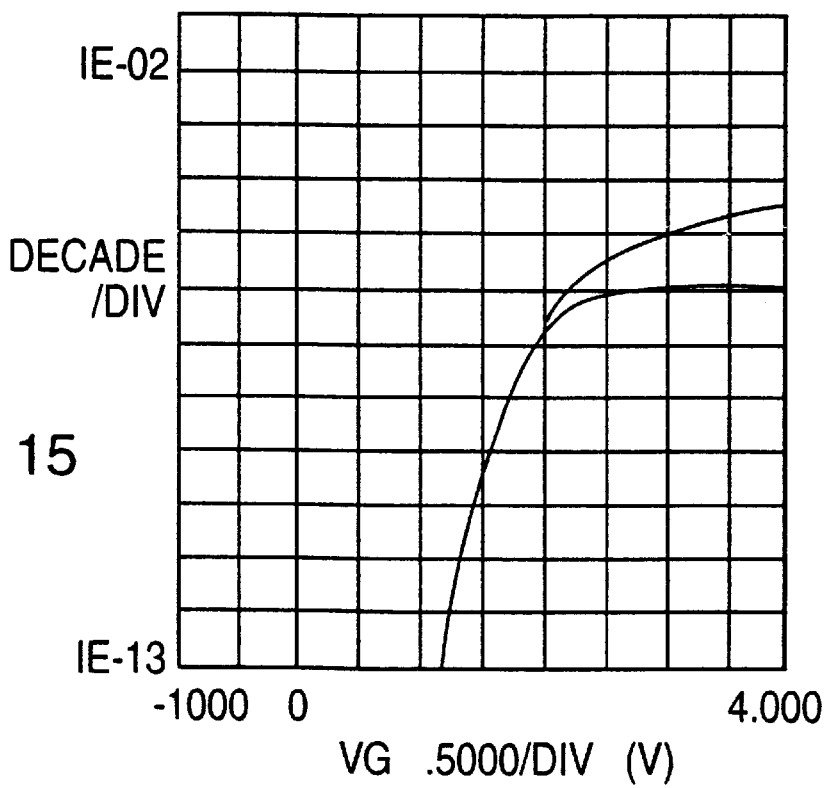
FIG. 15 is a further graphics plot, corresponding substantially to FIG. 14, but showing the subthreshold characteristic of the high-voltage transistor in accordance with the improvements of the present invention.

As a result, the parasitic sidewall components and the coupling between adjacent pixels is effectively eliminated. As shown in FIGS. 14 and 15, the nominal threshold voltage of the high-voltage transistor is raised for a sharp or abrupt cut-off.

With reference to FIGS. 6–13, the formation of the respective extended P+ regions 29 and 30 and the further improvements of the present invention (which are illustrated schematically) will become readily apparent to those skilled in the art. Moreover, it will be appreciated that the present invention is completely compatible with the conventional doping, etching and implanting techniques of currently-available process technology.

Figure 6:
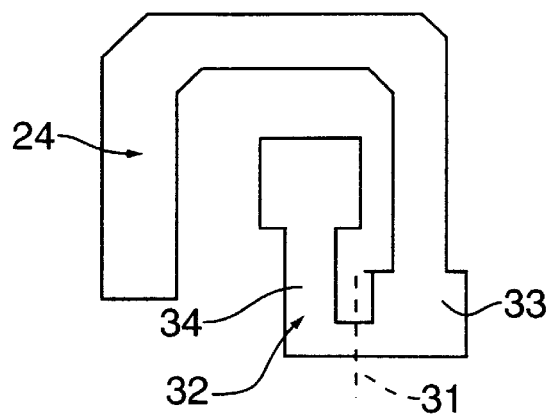
FIG. 6 is a schematic plan view of the high-voltage (blocking) transistor and the low-voltage pixel access transistor used in the prior art.

With this in mind, and with reference to FIG. 6, the high-voltage transistor 24 shares a division line or connector (indicated by the broken line 31) with the low-voltage transistor 32. The portion 33 of the high-voltage transistor 24 is too narrow; and as a result, there will not be a sufficient amount of P+ region to still have the N+ region align with the contact hole. Additionally, the portion 34 of the low-voltage access transistor 32 is too wide (relatively speaking) and thus the edges are not under direct gate control. As a result, there is a tendency for leakage and there is additional capacitance, which is undesirable.

Figure 7:
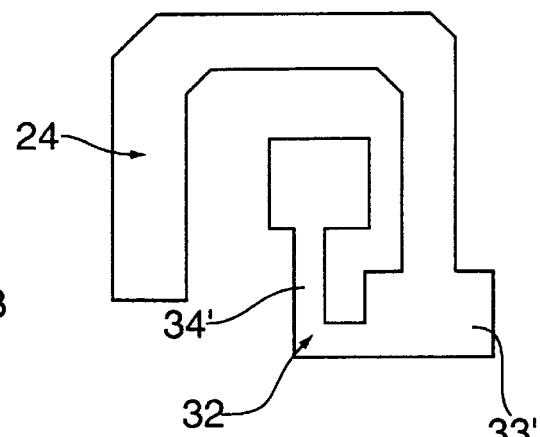
FIGS. 7–13 are further schematic plan views, showing a preferred embodiment of the progressive steps in the masking and doping process used in the present invention; and in each view, the dark lines indicate the addition to the previous structure.

Accordingly, and as shown in FIG. 7, the portion 33' of the high-voltage transistor 24 has been enlarged, while the portion 34' of the low-voltage transistor 32 has been narrowed.

Figure 8:
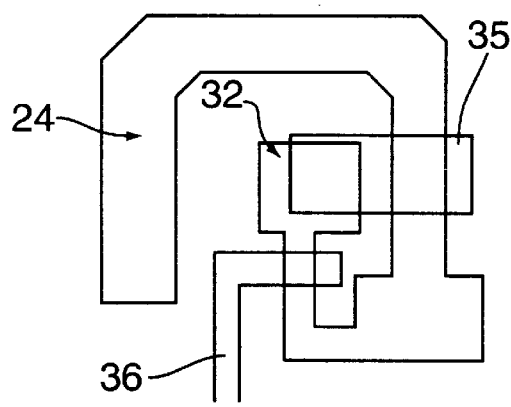

Next, and as shown in FIG. 8, a gate 35 has been provided for the high-voltage transistor 24 and a gate 36 for the low-voltage transistor 32.

Figure 9:
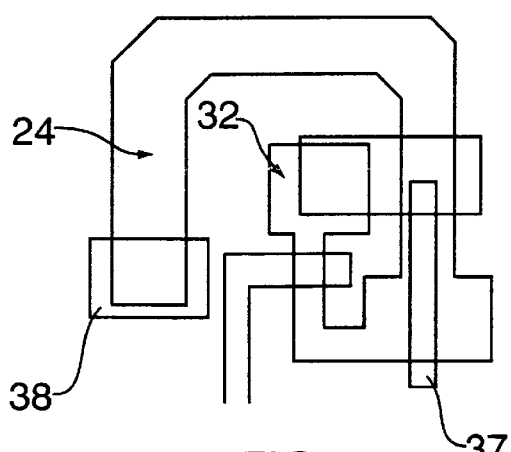

In FIG. 9, a highly-doped region 37 has been provided to form the N+ source and drain of the high-voltage transistor.

Figure 10:
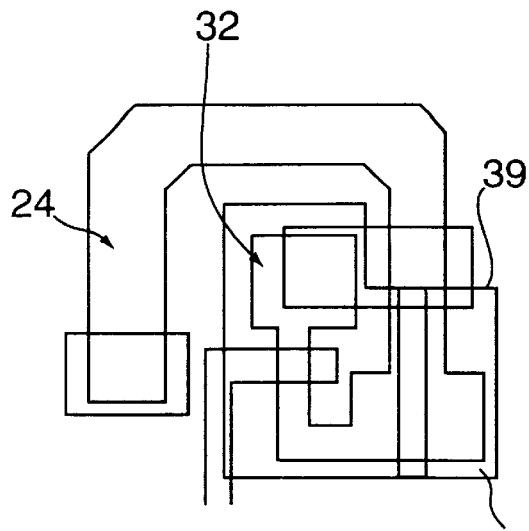

With reference to FIG. 10, the P+ region 39 has been implanted and allowed to penetrate. The process, well-known in the art, involves the high-energy injection of positively-charged species which penetrate to a certain depth. As will be noted by the darkened lines of the P+ region 39, this part of the mask is larger than the "island" to accommodate manufacturing tolerances. Moreover, in FIG. 10, the numeral 40 indicates the common source for the low voltage and high voltage devices (as will be understood by those skilled in the art).

Figure 11:
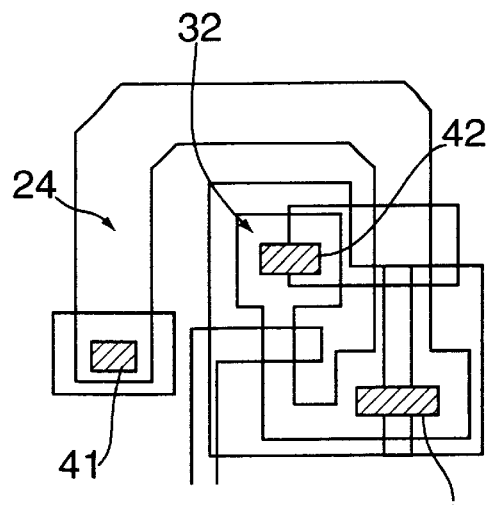

Thereafter, and as shown in FIG. 11, the contact holes are formed (as indicated by the darkened areas 41, 42 and 43, respectively).

Figure 12:
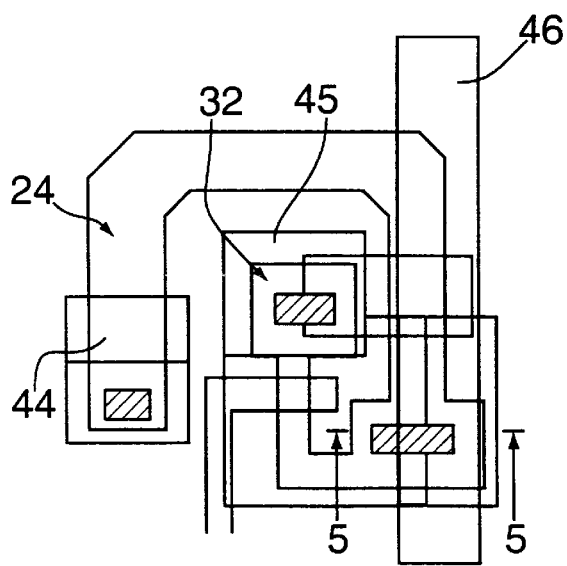

In FIG. 12, the process adds metal simultaneously for a number of purposes: first, for a later via to the EL electrode (illustrated schematically as region 44); second, to connect the low-voltage drain to the high-voltage gate and tie the P+ edges of the N+ source of the HV device (illustrated schematically as region 45); and third, to attach the sources of all respective pixels to the data line (illustrated schematically as region 46).

Figure 13:
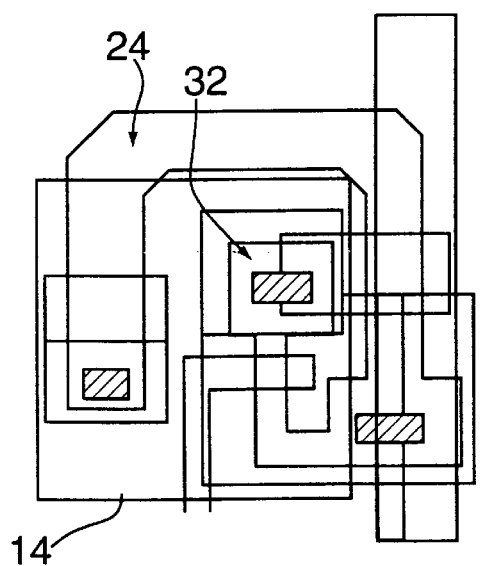

Finally, the via and EL electrode 14 are provided as shown in FIG. 13.

Accordingly, it will be appreciated that the present invention provides a novel high-performance pixel used, more particularly, in AMEL displays. The pixel combines a compact, mesa-isolated PMOS access transistor with a novel, area-efficient HV device. The high voltage transistor features a P+ region at each end of the source to effectively eliminate the parasitic sidewall component, raise the effective threshold voltage and reduce sensitivity to substrate potential variations. The improved design enhances pixel response, increases operating margins and contrast and may reduce power dissipation in the off-state.

Obviously, many modifications may be made without departing from the basic spirit of the present invention. Accordingly, it will be appreciated by those skilled in the art that within the scope of the appended claims, the invention may be practiced other than has been specifically described herein.

I claim:

1. An electronic display having at least one high-voltage transistor electrically connected to a pixel electrode and having a source comprising an N+ region having a first and second side edge, said first edge coincident with a side edge of a first P+ region and said source further comprising a second P+ region having a side edge coincident with said N+ second side edge.

2. The display of claim 1, wherein the electronic display is an active matrix electroluminescent display.

3. The display of claim 1, wherein the high-voltage transistor is formed on a silicon-on-insulator (SOI) thin film.

4. The display of claim 1, wherein a contact hole is provided for electrically connecting the high-voltage to a data line, and the N+ region is coincident with the contact hole.

5. The display of claim 4, wherein the contact hole is coincident with at least one of the P+ regions of the high-voltage transistor.

6. An electronic display having at least one high-voltage transistor electrically connected to a pixel electrode and having a source comprising a P+ region having a first and second side edge, said first edge coincident with a side edge of a first N+ region and said source further comprising a second N+ region coincident with said P+ second side edge.

7. The display of claim 6, wherein the electronic display is an active matrix electroluminescent (AMEL) display.

8. The display of claim 6 wherein the high-voltage transistor is formed on a silicon-on-insulator (SOI) thin film.

9. The display of claim 6, wherein a contact hole is provided for electrically connecting the high-voltage transistor to a data line, and the P+ region is coincident with the contact hole.

10. The display of claim 9, wherein the contact hole is coincident with at least one of the N+ regions of the high-voltage transistor.

* * * * *